United States Patent [19]

Yates et al.

[11] 3,998,601
[45] Dec. 21, 1976

[54] THIN FOIL

[75] Inventors: Charles B. Yates; Adam M. Wolski, both of Edgewater Park, N.J.

[73] Assignee: Yates Industries, Inc., Bordentown, N.J.

[22] Filed: Dec. 3, 1973

[21] Appl. No.: 421,236

[52] U.S. Cl. .............................. 29/195; 29/199; 156/233; 204/12

[51] Int. Cl.² ..................... C25D 1/04; C25D 1/22; B23P 3/00

[58] Field of Search ............ 204/3, 4, 12, 13, 38 E, 204/281, 208, 216; 29/195, 199; 161/213, 164, 166; 148/31.5, 34; 156/233

[56] References Cited
UNITED STATES PATENTS

| | | | |
|---|---|---|---|
| 454,381 | 6/1891 | Reinfeld | 204/12 |
| 510,013 | 12/1893 | Endruweit | 204/12 |
| 676,357 | 6/1901 | Endruweit | 204/12 |
| 880,484 | 2/1908 | Edison | 204/12 |
| 1,494,152 | 5/1924 | Cowper-Coles | 204/12 |
| 1,574,055 | 2/1926 | Pedersen | 204/12 |
| 1,589,564 | 6/1926 | Robinson | 204/12 |
| 1,709,801 | 4/1929 | Muller | 204/40 |
| 1,760,028 | 5/1930 | Williams et al. | 204/12 |
| 1,924,410 | 8/1933 | Marker | 204/12 |
| 2,105,440 | 1/1938 | Miller | 204/12 |
| 2,203,253 | 6/1940 | Brown | 204/12 |
| 2,433,441 | 12/1947 | Davidoff | 204/13 |
| 3,293,109 | 12/1966 | Luce et al. | 204/52 |
| 3,617,450 | 11/1971 | Kawaguchi | 204/12 |

FOREIGN PATENTS OR APPLICATIONS

| | | | |
|---|---|---|---|
| 792,930 | 6/1973 | Belgium | |
| 1,571,857 | 5/1969 | France | |
| 108,173 | 5/1964 | Netherlands | |
| 853,422 | 11/1960 | United Kingdom | |
| 275,221 | 1/1928 | United Kingdom | 204/12 |
| 274,426 | 12/1927 | United Kingdom | 204/12 |

OTHER PUBLICATIONS

Extractive Metallurgy Joseph Newton 1959 (p. 466).
Hydrometallurgy of Base Metals George Van Arsdale 1953 pp. 118–123.
German Offenlegungsschrift 2,242,132 Mar. 8, 1973.
Product Engineering June 5, 1961 pp. 609–614.

*Primary Examiner*—T. M. Tufariello
*Attorney, Agent, or Firm*—Lane, Aitken, Dunner & Ziems

[57] ABSTRACT

A composite foil having an electrolytically formed copper or copper-containing layer and a second electrolytically formed copper layer of a thickness which is not self-supporting, the copper layer and the second metal layer being separated by a coating of a release agent. A process for producing such a composite foil wherein the thin copper layer is formed in a single plating bath containing a copper acid electrolyte. A method for producing copper clad elements suitable for the manufacture of printed circuits from such foils and laminates so produced.

36 Claims, No Drawings

THIN FOIL

BACKGROUND OF THE INVENTION

The present invention relates to supported ultrathin copper foil, to a method of producing copper clad laminates therefrom and to the laminates so produced. The terms "ultrathin" and "non-self-supporting" are used herein to describe copper layers having thicknesses no greater than about 12 microns. Foils of such thinness are subject to damage under the force of their own weight if unsupported.

Printed circuit elements are commonly manufactured from copper clad laminates by means of an etching process. The copper clad laminates used in the manufacture of printed circuits are commonly forced from copper foil and a substrate insulating material by application of heat and pressure in a laminating press. In the standard etching process, the copper clad surface is coated with a photoresist material and then covered with a mask defining the desired circuitry. The photoresist is then exposed in light causing that portion representing the desired circuitry lines to develop and harden. The undeveloped photoresist is washed away and the masked surface is then treated with an etching solution to remove the unwanted, exposed portions of the copper.

A problem commonly encountered in such processes is termed "under-cutting" wherein the etching solution during removal of the unwanted copper attacks the mask-protected copper lines from the side, below the masking. This problem is particularly acute where it is desired to produce a circuit having very fine lines.

One solution to this problem is to employ a very thin layer of copper cladding. As the thickness of the copper cladding is decreased, further advantages accrue, i.e. the necessary etching time is decreased and the problems associated with the disposal of the spent copper-containing etching solution are diminished.

Thus, there exists a demand for a process suitable for the commercial production of ultrathin foils in quantity. However, in the manufacture of ultrathin foils, unique problems, not associated with the production of thicker foils, are encountered. These problems may be categorized as (1) difficulties associated with the nature and limitations of the plating surface and (2) difficulties encountered in handling and working with a non-self-supporting ultrathin foil product.

Several solutions directed to the latter category of difficulties have previously been proposed. U.S. Pat. No. 2,105,440 issued in 1938 to Miller recognized that the thinness and lack of mechanical strength of such ultrathin foils precluded conventional methods of foil manufacture wherein the foil is mechanically stripped from a cathode drum or plate. Miller proposed to increase the mechanical strength of ultrathin foils by affixing a fibrous or paper backing to the exposed surface of the foil prior to removal of the foil from a rotating cathode. The method of Miller closely resembles that disclosed in an earlier patent, U.S. Pat. No. 454,381 issued to Reinfeld in 1891. However, the concept of gluing a paper to an electrode deposit on the face of a moving drum presents other problems. For example, Miller uses a quick-setting resinous adhesive because of the short time available for the adhesive to set before removal from the cathode which must move at a commercially feasible speed. The difficulty of removal of such resinous adhesives would present a significant problem if a foil such as that produced by Miller were to be used in the production of printed circuit elements. The thin copper layer of Miller, if laminated on its free surface to a second resinous substrate, would show little preference for adherence to one or the other substrate. Even if one were to devise a method for selectively removing the paper and first resin without tearing the thin copper layer, the surface of the thin copper would still require cleaning to remove traces of the first resin.

The process described in the copending application of Adam M. Wolski, U.S. Ser. No. 354,196 filed Apr. 25, 1973 and entitled "Thin Foil", adopts an entirely different approach to the problem addressed by Miller and Reinfeld. The process of such copending application circumvents the problems of separating the thin foil from the cathode by using a disposable cathode or temporary carrier and leaving the thin foil attached to the carrier through a laminating step wherein the thin foil is laminated to and thus supported by a resinous substrate prior to removal of the original carrier. The foil of this earlier invention comprised an ultrathin layer supported by aluminum and separated therefrom by an intermediate anodized layer of aluminum oxide. Such a composite foil offers a highly desirable advantage in laminating applications in that aluminum and aluminum oxide separate cleanly from the laminate without leaving a residue on the copper surface. Moreover, the thick anodized release layer allows relatively easy separation, thus minimizing the danger of tearing the ultrathin foil.

The process of such prior application successfully overcomes those problems associated with the thinness and lack of mechanical strength of the thin foil. However, the plating of copper on aluminum is limited to the use of copper plating solutions which will not attack or adversely affect the aluminum or aluminum oxide plating surface. The temporary aluminum carrier is relatively immune from attack in copper fluoborate and copper pyrophosphate plating baths, but is not suited for use in acid/copper plating baths or in cyanide plating because the acidic and caustic electrolytes will dissolve the protective aluminum oxide. Unfortunately for the commercial prospects of this process, acidic copper plating baths are the most widely used and commercially preferred for several reasons. An acid/copper bath allows the use of higher cathode current densities than are feasible in connection with cyanide and pyrophosphate plating baths. Fluoborate baths require the use of soluble anodes of refined copper and involve a more sensitive and complex plating process. The plating of copper from an acid bath gives a crystalline structure that is preferred for use in printed circuit laminates because of the higher adhesiveness to a resinous substrate which it provides. Another important advantage is that the acid copper plating bath provides a convenient means for recovery and reuse of the copper scrap. In such a system the scrap copper is merely added to an acid bath wherein it is dissolved with the help of aeration to form copper sulphate. In contrast, in other systems the copper must be first converted to another salt form by an unrelated process before it can be reused in the copper plating bath. Although waste disposal represents a problem with acidic copper plating baths, these disposal problems are not regarded as severe as those associated with other commonly used copper plating systems.

Thus, a need exists in the art for a composite foil that will offer the advantages of aluminum/copper foil composites, i.e. clean separation from the thin copper clad laminate, and which can be manufactured using an acidic copper plating bath.

It is well known that a copper sulfate/sulfuric acid electrolyte cannot be used to plate copper on surfaces of metals which would displace copper from solution. Thus, aluminum and zinc are not sufficiently immune from attack to serve as suitable plating surfaces in an acidic electrolyte without special treatment. Metals such as chromium, steel, nickel and lead, commonly employed as plating surfaces for copper in acidic systems, are either too expensive for use as disposable carriers in the manner contemplated by said earlier application U.S. Ser. No. 354,196 or are otherwise impracticable.

SUMMARY OF THE INVENTION

In accordance with the present invention, a novel composite foil is provided which foil comprises a copper foil or carrier formed by electrodeposition, a second copper layer of a thickness which is not self-supporting and a coating of a release agent located intermediate the copper carrier and the second copper layer. The release coating or layer is formed of a material which is relatively resistant to attack by a copper sulphate-sulphuric acid plating electrolyte and which permits clean and easy separation of the non-self-supporting copper layer.

The carrier for the thin foil, which consists of the copper layer and the coating of the release agent deposited thereon, enables a process for forming the ultrathin layer using a single plating bath containing a copper sulphate/sulphuric acid electrolyte.

In a preferred embodiment, the release layer is chromium and the surface of the chromium is "hydrogen-scrubbed" by cathodic treatment in an aqueous acid-containing electrolyte.

The copper and release coating provide a carrier for the ultrathin foil that supports the thin foil during the laminating process used to form printed circuit elements and which presents a release surface which permits clean and easy separation (with minimal danger of tearing) after the laminate has been formed. The laminates of the present invention are produced by superimposing the foil on the insulating material with the ultrathin layer in contact with the insulating material or substrate, and laminating the assembly. During lamination, the copper layer of the composite foil serves as a barrier to prevent penetration through the ultrathin layer by the resin of the substrate.

Accordingly, it is an object of the present invention to provide a supported ultrathin copper foil which is capable of being taken up into rolled form.

It is a further object of this invention to provide a composite foil comprising an ultrathin copper layer and a carrier therefor which may be laminated to a resinous substrate without resin bleed-through.

It is yet another object of the present invention to provide a composite foil comprising an ultrathin copper layer and a carrier therefor wherein the carrier is provided with a release surface which is resistant to acid attack and which allows the ultrathin layer to be readily stripped therefrom without tearing after lamination to a resinous substrate.

These and other objects and advantages of the present invention will become more apparent in connection with the ensuing description and appended claims.

DETAILED DESCRIPTION OF THE PREFERRED EMBODIMENTS

As previously noted, the present invention provides a composite foil comprising an ultrathin copper layer and a carrier therefor wherein the carrier is provided with a release surface which provides clean and easy separation of the ultrathin copper after lamination. The electrolytically formed copper foil or carrier, which forms the support layer of the composite foils of the present invention, provides a highly receptive plating surface and is highly resistant to attack by copper/acid electrolytes. Copper is also a desirable material for use as the support layer because it provides the degree of mechanical strength required in the production of the composite foil and in the subsequent laminating end use applications.

The use of copper as the carrier or support layer further offers a significant economic advantage in that it may be recycled and directly reused in the copper/acid plating system without first being converted to a salt in a nonrelated process. In the case of foils having copper as the ultrathin layer, a further economic advantage is provided in that scraps and cuttings may be recycled to the acid plating bath along with the stripped copper carrier. In this latter case the scraps essentially contain one metal only, the metallic release coating representing a neglible impurity. In addition, the use of copper for both the carrier and ultrathin layers minimizes chemical problems which might otherwise exist with "mixed" composites such as would be produced were the carrier layer to be copper and the ultrathin layer to be a metal such as nickel, gold, silver or the like.

A further, and perhaps the most significant, advantage afforded by a copper foil carrier is its commercial availability in the form of an electrolytically deposited foil. It has been discovered that metal foils produced by rolling contain voids or discontinuities which present a significant problem in the production of ultrathin foils. The discontinuities in rolled metal foils result from the inclusion of minute gas bubbles in the metal ingots from which they are formed. The minute voids in the metal ingots are elongated in the rolling process producing the discontinuities characteristic of such foils. Rolled metal surfaces are satisfactory in the production of foils of conventional thicknesses because as the metal is electrodeposited thereon it tends to weld together at the discontinuities presented by the rolled metal substrate. However, it has been discovered that in the production of ultrathin foils, the amount of metal deposited by electrodeposition is insufficient to allow for "welding" at such surface discontinuities in the substrate. In contrast, foils produced by electrodeposition present a highly uniform continuous surface for the formation of ultrathin metal deposits.

The use of electrodeposited copper foil as the support layer also makes possible greater flexibility in terms of the surface characteristics of the ultrathin copper foil layer. The support layer when produced by conventional electrolytic techniques will have a shiny and a matte surface. Since the surface of the ultrathin copper foil will conform to that of the support layer, the former can be varied at will by using the shiny or the matte surface of the support foil. Furthermore, the nature of the matte surface itself can be varied at will to provide the ultrathin foil with varying degrees of matte surface characteristics.

TABLE 1

| | AQUEOUS SULFIDE IMMERSION BATH | |
|---|---|---|
| | Operating Range | Preferred |
| Cathode | 1–5 oz. Cu Foil | 2 oz. (60 micron) Electrolytic Cu Foil |
| Aqueous Bath Composition: | | |
| Sodium Sulfide | 0.25–50 g/liter | 1 g/liter |
| Bath Temperature | Room–250° F | Room |
| Duration of Dip | 3 sec.–3 min. | 30 secs. |

An appropriate thickness for the copper support foil is from about 30 microns to about 150 microns, a 30 micron thickness corresponding to a one ounce copper foil and a 150 micron thickness corresponding to a 5 ounce copper foil.

The ultrathin copper layer of the present invention will be electrodeposited and non-self-supporting, viz., will have a thickness no greater than about 12 microns. Ultrathin copper layers about 2–12 microns thick can be formed in accordance with the present invention.

The release coating, which is located intermediate the support layer and the ultrathin layer, may be any material which (1) is sufficiently conductive and sufficiently uniform in its surface characteristics to allow the electrodeposition of a continuous ultrathin copper layer thereon and (2) allows the support layer to be mechanically stripped from a laminate without tearing the ultrathin layer. Suitable release layers include oxides and salts such as sulfides, chromates and the like. Coatings of such compounds may be formed on the surface of the carrier either by electrolytic deposition or by simple immersion in an appropriate solution.

The above operating parameters of the immersion bath, composition, temperature and duration of dip, may be varied over wide ranges. For example, a sulfide coating of a given thickness can be obtained either by immersion for a brief time in a bath of high concentration or by immersion for a longer period of time in a bath of lower concentration.

The chromate release layers may be formed electrolytically in aqueous electrolytes containing hexavalent chromium ions or simply by immersion in like solutions. Suitable electrolytic solutions may be formed by the dissolution in water of chromium salts such as chromium trioxide, potassium dichromate, sodium dichromate, ammonium dichromate, and potassium chromate. The most commonly used compound is chromium trioxide which is also known as "anhydrous chromic acid" and which is available commercially in flake form. Additives such as sulphuric acid or sulphates, hydrochloric acid or chlorides, nitric acid or nitrates, or acetates may optionally be added to the electrolyte. The operating parameters for a typical aqueous chromate treatment bath are set forth below in Table 2.

TABLE 2

| | TYPICAL CHROMATE BATH | |
|---|---|---|
| | Operating Range | Preferred |
| Cathode | 1–5 oz. Cu Foil | 2 oz. (60 micron) Electrolytic Cu Foil |
| Aqueous Electrolyte: | | |
| Chromic Acid (g/liter) (calc. as $CrO_3$) | 3–50 | 10 |
| Electrolyte Temperature | Room–Boiling | 140° F |
| Cathode Current Density (amps/ft.$^2$) | 1–50 | 25 |
| Duration of Dip | 5 sec.–5 min. | 30 sec. |
| Anode | Pb plate | Pb/Sb Alloy |

Metals such as chromium, lead, nickel and silver are the preferred release layers.

A sulfide release layer may be formed either by simple immersion of the carrier foil in an aqueous sulfide solution or by electrolytic treatment in a sulfide containing electrolyte. Various allotropic forms of cupric sulfide, crystalline and amorphous, may be formed on the surface of a copper foil or carrier by immersion in an aqueous solution of a suitable sulfide such a sodium sulfide, potassium sulfide, ammonium sulfide, or polysulfides, such as ammonium polysulfide having the formula $[[NH_4]_2S]_n$. Cuprous sulfide may be formed on the surface of a copper substrate by electrolytic deposition from like solutions. While sulfide release layers are useable in the present invention, a disadvantage of such release layers resides in the fact that the adhesion of the sulfide release agent is not selective with respect to either the substrate or the thin metal and, therefore, separation at the release layer results in a clad surface which must be cleaned prior to subsequent process steps. The operating parameters for a typical sulfide immersion bath are set forth in Table 1, below.

The chromate release coatings, formed as described above, are less preferred than metallic release coatings because of the difficulty in forming a chromate coating which is sufficiently receptive to copper plating to enable the formation of ultrathin foils and which provides the desired separation. Very thin layers of chromate may make it more difficult to effect release of the ultrathin layer without tearing. On the other hand, the thicker the chromate coating, the less receptive to copper plating the coating becomes.

As previously noted, metallic release agents such as chromium, lead, silver and nickel are preferred for use in forming the release layers of the present invention. These metals are preferred as release agents because they are more resistant to abrasion by the foil handling apparatus and present highly receptive plating surfaces, even when plated on the carrier as coatings of extreme thinness, for example, on the order of 2/10 of a micron.

If the use of an acid/copper plating bath is contemplated, the metallic release layer should be acid resistant and should provide a release surface which permits clean and easy separation from the thin copper layer after lamination. Nickel, silver and lead are satisfactorily resistant to attack by the sulphuric acid and copper plating baths, as evidenced by their relatively low positions in the electromotive series. Chromium also resists attack by acid electrolytes because it passivates itself by forming a minute coating of non-soluble chromium oxide on its surface.

Chromium is the preferred material for the release layer because it separates cleanly from the copper leaving a non-contaminated copper surface, and requires little or no auxiliary release agent. Chromium exhibits a totally selective adhesion to a copper substrate because chromium electrodeposited on copper forms a much stronger bond than does copper electrodeposited on chromium. In contrast, as noted in U.S. Pat. No. 454,381 to Reinfeld, a nickel plating surface requires the use of an auxiliary release agent such as chromate. Lead tends to leave traces on the surface of the thin metal surface after separation. For a discussion of the problems associated with plating copper on lead surfaces, see U.S. Pat. No. 1,978,037 issued to Yates.

The chromium release layer provides satisfactory separation from the thin copper foil even when applied to the metal support layer as a coating less than 1 micron in thickness. Thicker coatings of chromium are also satisfactory but are less economical and present an obstacle to the reuse of scrap in the copper/acid plating bath.

The thin coating or "flash" of chromium may be applied to either the shiny or the matte surface of the electrodeposited copper carrier. Deposition on the matte surface results in a thin copper clad laminate having a satin finish. Deposition on the shiny side of the electrodeposited metal carrier results in a thin copper clad laminate having a mirror-like finish.

The flash of chromium is formed on the metal support foil or carrier by passing the metal foil, in serpentine fashion, through any standard chromium plating bath. Chromium plating baths containing both chromic acid and sulfuric acid, in ratios of chromic acid (calculated as $CrO_3$) to sulfuric acid of 125:1 to 75:1 are preferred but other ratios and other electrolytes may also be employed. High concentrations of chromic acid and high temperatures tend to decrease the efficiency of the bath and must be offset by using longer residence times within the electrolyte and higher cathode densities. The operating parameters for a typical chromium plating bath are set forth in Table 3, below.

Table 3

| | Typical Chromium Plating Bath | |
|---|---|---|
| | Operating Range | Preferred |
| Cathode | 1–5 Oz. Cu Foil | 2 oz (60 microns) Electrolytic Cu Foil |
| Aqueous Electrolyte: | | |
| Chromic Acid (g/liter) (Calc. as $CrO_3$) | 150–400 | 350 |
| $H_2SO_4$ (g/liter) | 1.5–4.0 | 3.5 |
| Electrolyte Temperature | Room–140° F | 80° F |
| Cathode Current Density (amps/ft$^2$) | 100–400 | 125 |
| Duration of Dip | 15 sec–3.min. | 30 sec. |
| Anode | Pb | Pb/Sb alloy |

A problem which may occur in plating copper on a chromium surface, depending on bath conditions, etc., is that the chromium surface may oxidize to such an extent that the uniform plating of an ultrathin copper layer thereon becomes difficult. The chromium oxide surface coating which provides the chromium with satisfactory resistance to the acidic electrolyte may also serve to impede the plating process. Accordingly, in the present invention the surface of the chromium may optionally be cleaned and stabilized against oxidation by a process which I refer to as "hydrogen-scrubbing", "cathodization", or "depassivation", which are different phrases for describing a treatment which results in the removal of at least a portion of the oxide coating which spontaneously forms on the chromium surface.

The chromium surface may be hydrogen scrubbed by passing the chromium plated carrier foil through an aqueous solution of sodium chloride, sodium hydroxide, citric acid, sulphuric acid, or phosphoric acid. Aqueous solutions of phosphoric acid have been found to be particularly effective. The chromium surface after the electrolytic treatment in an aqueous phosphoric acid solution has been found to be particularly receptive to copper plating in copper/acid baths. The operating parameters for a phosphoric acid hydrogen-scrubbing bath are set forth in Table 4. The potential between the foil and the anode is regulated to produce a visible evolution of hydrogen at the chromium surface.

Table 4

| | Typical Cathodization Bath | |
|---|---|---|
| | Operating Range | Preferred |
| Cathode | | Chromium plated Cu Foil |
| Aqueous Electrolyte: | | |
| $H_3PO_4$ (g/liter) | 1–20 | 5 |
| Electrolyte Temperature | Room–boiling | 80° F |
| Foil-Negative Potential relative to Anode | 2–20 volts | 7 volts |
| Duration of Dip | 5 secs–3 min | 30 secs |
| Anode | Pb | Pb/Sb alloy |

The chromium plated carrier foil is water washed and then rendered cathodic and routed through a copper electroplating bath wherein the side carrying the chromium flash is plated with a layer of copper, about 2–12 microns in thickness.

The copper/acid electrolytes of the present process contain about 40 to 110 grams/liter of metallic copper, about 40 to 130 grams/liter of sulphuric acid and, optionally, a minor amount of a grain refining agent, such as bone glue. It will be appreciated by those skilled in the art that higher copper concentrations require higher bath temperatures to keep the copper sulphate in solution. The operating parameters for an acid/copper plating bath are summarized below in Table 5.

TABLE 5

| | Copper Plating Bath | |
|---|---|---|
| | Operating Range | Preferred |
| Cu (calculated as metallic copper) | 40–110 | 100 g/liter |

TABLE 5-continued

| | Copper Plating Bath | |
|---|---|---|
| | Operating Range | Preferred |
| H$_2$SO$_4$ (g/liter) | 40–130 | 70 |
| Bone glue (mg/liter) | 0–10 | 4 |
| Temperature ° F) | Room–160 | 140 |
| Cathode Current Density (amps/ft$^2$) | 50–300 | 125 |
| Duration of Dip (sec) | 40–250 | 105 |
| Anode | Pb | Pb/Sb |

The copper surface of the composite foil may be electrolytically treated to improve its adhesion to the various laminating materials commonly employed in the manufacture of printed circuit chips or elements and to preserve the integrity of the foil, but the particular treatment employed forms no part of this invention and any process which produces an electrolytic deposit of nodular or dendritic copper on the copper surface may be employed.

The preferred laminating procedure of the present invention improves superimposing the composite foil on top of a resinous insulating substrate with the ultrathin copper surface in contact with the resinous material. The foil-substrate assembly is then placed in a conventional laminating press and subjected to heat and pressure to form a laminate. After cooling, the chrome plated copper support layer may be peeled off leaving a laminate clad with an ultrathin layer of copper which is suitable for the production of printed circuit elements.

Conventional laminating presses are employed. These presses are usually provided with two opposing hollow plates through which a heating or cooling fluid is circulated. During the heating cycle, steam, e.g. super-heated steam at about 300°–400° F, is passed through the hollow plates concurrent with the application of a pressure of about 200–500 psi depending on the nature of the resin used and the resin content of the fiberglass.

As will be apparent to those skilled in the art, the particular substrate used in this laminate will vary depending upon the use for which the laminate is intended and the service conditions under which such laminate will be used. Particularly appropriate substrates which adapt the laminate for use in forming printed circuits include non-flexible supports such as Teflon-impregnated fiberglass ("Teflon" is the trademark for polytetrafluoroethylene), "Kel-F" impregnated fiberglass ("Kel-F" is a trademark for certain fluorocarbon products including polymers of trifluorochloroethylene and certain copolymers), epoxy-impregnated fiberglass and the like. Flexible substrates include polyimides such as those known under the designation "Kapton" and "H-Film" (both are manufactured by Dupont and are polyimide resins produced by condensing a pyromellitic anhydride with an aromatic diamine).

The ultrathin copper layer of the laminates of the present invention may be somewhat porous but the metal carrier or support layer of the composite prevents resin bleed-through during the laminating step. As previously noted, resin bleed-through would otherwise result in resin deposits on the ultrathin copper surface of the laminate which would require removal prior to conversion into a circuit by etching.

EXAMPLE

In a specific example of the process of the present invention, a 2 ounce electrolytically formed copper foil, approximately 60 microns in thickness, is successively passed in serpentine fashion through four electrolytic treatment baths. The first bath is a chromium plating bath having a lead/antimony plate anode and an aqueous electrolyte containing about 350 grams/liter of chromic acid and about 3.5 grams/liter of sulphuric acid and which is maintained at a temperature of about 80° F. The speed of the foil as it moves through the chromium plating bath is regulated so that the duration of the treatment for any one unit area of the foil is approximately 30 seconds. In passing through the bath, the copper foil is rendered cathodic with a cathode current density of about 125 amps per square foot. This treatment results in the deposition of a flash of chromium on one surface of the copper foil, approximately 2/10 of a micron in thickness.

After leaving the chromium plating bath, the foil is passed through a wash station where it is sprayed with water to remove any adhering electrolyte and is then passed in serpentine fashion through a second electrolyte bath (optional) containing an aqueous solution of phosphoric acid and lead/antimony plates as the anodes. The concentration of the phosphoric acid is about 5 grams per liter and the temperature of the electrolyte is about 80° F. A negative potential of about 7 volts relative to the lead anode is applied to the foil and the duration of immersion in the electrolyte is approximately 30 seconds for each unit area of the foil.

After emerging from the phosphoric acid or hydrogen-scrubbing bath, the foil is again washed and then passed through an acid/copper plating bath. The aqueous electrolyte of the copper plating bath contains about 100 grams/liter of metallic copper, about 70 grams/liter of sulphuric acid, and about 4 mg/liter of bone glue and is maintained at a temperature of about 140° F. Again, the foil is rendered cathodic with respect to lead/antimony plate anodes with a current density of about 125 amps per square foot. A treatment time of 105 seconds per unit area of the foil results in the deposition of an ultrathin layer of copper approximately 5 microns in thickness.

The fourth electrolyte treatment is the optional treatment wherein dendritic copper is electrodeposited on the thin copper surface of the foil to improve its adhesiveness and bonding with respect to the substrate materials used in the printed circuit industry. If desired, the foil may be stainproofed by a conventional technique after the treatment step.

A laminate is formed by superimposing the composite foil produced as above on epoxy-impregnated fiberglass with the ultrathin copper surface in contact with the epoxy-glass substrate. The assembly is then placed in a conventional laminating process and subjected to a heating pressure cycle wherein super-heated steam at 340° F is passed through the hollow plates of the laminating press and a pressure of 450 psi is applied. While the laminate is still hot, water at room temperature is introduced into the hollow laminating plates to cool the laminate. The laminate is removed from the press after cooling for 20 minutes and the chromium plated copper carrier is then peeled away to produce a thin copper clad laminate suitable for etching, etc. in the production of printed circuit elements.

The invention may be embodied in other specific forms without departing from the spirit or the essential characteristics thereof. The present embodiments are therefore to be considered in all respects as illustrative and not restrictive, the scope of the invention being indicated by the appended claims rather than by the foregoing description. All changes which come within the meaning and range of equivalency of the claims are therefore intended to be embraced therein.

We claim:

1. A composite foil comprising an electrodeposited copper support layer, a second electrodeposited copper layer of a thickness which is not self-supporting and a thin layer of a release agent intermediate said copper support layer and said second copper layer, said composite foil being capable of being taken up into rolled form.

2. The composite foil of claim 1 wherein said second layer has a thickness of about 2–12 microns.

3. The composite foil of claim 1 wherein said release agent is selected from sulphides, chromates and oxides.

4. The composite foil of claim 1 wherein said release agent is a metal.

5. The composite foil of claim 1 wherein said release agent comprises a metal selected from chromium, lead, nickel and silver.

6. The composite foil of claim 1 wherein said release agent is chromium.

7. A composite foil comprising an electrodeposited copper support layer, a second electrodeposited copper layer of a thickness which is not self-supporting and a thin layer of depassivated chromium intermediate said copper support layer and said second copper layer.

8. The composite foil of claim 7 wherein said depassivated chromium is formed by subjecting a chromium layer to hydrogen scrubbing to remove at least part of the oxide coating on the surface of said chromium.

9. The composite foil of claim 8 wherein said second layer has a thickness of about 2–12 microns.

10. A laminate comprising the composite foil of claim 1, the second copper layer of which is bonded to a resinous insulating substrate.

11. A method for forming a composite foil suitable for use in the manufacture of printed circuits comprising electrodepositing a layer of copper in a non-self-supporting thickness on an electrically conductive electrodeposited copper foil carrier which is capable of being taken up into rolled form, the surface of said carrier over which said layer of copper is deposited having a coating of an agent which will permit release of said metal from said carrier without tearing.

12. A method as defined in claim 11 wherein said layer of copper is electrodeposited on said copper foil carrier containing said release agent by passing said carrier through a copper-containing acid sulphate electrolyte and rendering said carrier sufficiently cathodic to cause a non-self-supporting layer of copper to electrodeposit thereon.

13. A method as defined in claim 11 wherein said release agent is chromium.

14. The composite foil of claim 1 wherein said carrier layer has a thickness of from about 30 to 150 microns.

15. A composite foil produced in accordance with the process of claim 11 comprising an electrodeposited copper support layer, a second electrodeposited copper layer of a thickness which is not self-supporting and a thin layer of a release agent intermediate said copper support layer and said second copper layer, said composite foil being capable of being taken up into rolled form.

16. The composite foil of claim 15 wherein said second layer has a thickness from about 2 to 12 microns.

17. The composite foil of claim 15 wherein said release agent is selected from sulfides, chromates and oxides.

18. The composite foil of claim 15 wherein said release agent is a metal.

19. The composite foil of claim 15 wherein said release agent comprises a metal selected from chromium, lead, nickel and silver.

20. The composite foil of claim 15 wherein said release agent is chromium.

21. The composite foil of claim 15 wherein said carrier layer has a thickness of from about 30–150 microns.

22. The composite foil of claim 15 wherein the matte surface of said electrodeposited copper support layer is facing said second layer of copper.

23. A method for forming a composite foil suitable for use in the manufacture of printed circuits comprising electrodepositing a layer of copper in a non-self-supporting thickness on an electrically conductive electrodeposited copper foil carrier, said carrier being capable of being taken up into rolled form, the surface of said carrier over which said layer of copper is deposited having a coating of at least partially depassivated chromium which will permit release of said layer of copper from said carrier without tearing.

24. A method as defined in claim 23 wherein said depassivation is accomplished by passing the copper foil carrier coated with said release agent through an aqueous acid solution and rendering said foil carrier sufficiently cathodic to cause hydrogen to evolve at its surface.

25. A method as defined in claim 24 wherein said acid solution is a phosphoric acid solution.

26. A composite foil produced in accordance with the method of claim 24 comprising an electrodeposited copper support layer, a second electrodeposited copper layer of a thickness which is non-self-supporting and a thin layer of depassivated chromium intermediate said copper support layer and said second layer.

27. A method as defined in claim 23 wherein said depassivation is accomplished by hydrogen scrubbing.

28. A method of forming a copper clad laminate suitable for use in the manufacture of printed circuits comprising superimposing the composite foil of claim 22 on a resinous insulating substrate with said layer of copper in contact with said substrate and laminating said composite foil to said substrate.

29. The copper clad laminate produced by the method of claim 28.

30. The method of claim 28 additionally comprising peeling said foil carrier off of said laminate.

31. The copper clad laminate produced by the method of claim 30.

32. A composite foil produced in accordance with the method of claim 27 wherein said depassivated chromium is formed by subjecting a chromium layer to hydrogen scrubbing to remove at least a portion of the oxide coating on the surface of said chromium.

33. The composite foil of claim 32 wherein the layer of non-self-supporting copper has a thickness of from about 2–12 microns.

34. A laminate formed in accordance with the process of claim 25.

35. The composite foil of claim 1 wherein the matte surface of said electrodeposited copper support layer is facing said second layer of copper.

36. A method as defined in claim 11 wherein said layer of copper is electrodeposited on the matte side of said electrodeposited copper foil carrier.

* * * * *